UShtml

United States Patent
Komino et al.

Patent Number: 6,157,774
Date of Patent: *Dec. 5, 2000

[54] VAPOR GENERATING METHOD AND APPARATUS USING SAME

[75] Inventors: Mitsuaki Komino, Nakano-ku; Osamu Uchisawa, Sendai, both of Japan

[73] Assignees: Tokyo Electron Limited, Tokyo; Motoyama Eng. Works, Ltd., Sendai, both of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/079,767

[22] Filed: May 15, 1998

[30] Foreign Application Priority Data

May 16, 1997 [JP] Japan .................................. 9-141111

[51] Int. Cl.[7] .............................. A01G 13/06; F23D 11/10
[52] U.S. Cl. ............................................ 392/387; 239/423
[58] Field of Search .................................... 392/386, 387, 392/394, 396, 397; 239/310, 318, 423, 434, 135; 118/724, 725, 726, 727, 723 VE; 261/138, 139, 141, 142, 34.1, 37, DIG. 55, DIG. 65

[56] References Cited

U.S. PATENT DOCUMENTS

| | | | |
|---|---|---|---|
| 2,507,464 | 5/1950 | Andrade So | 392/397 |
| 3,200,764 | 8/1965 | Saunders, Jr. | |
| 3,854,032 | 12/1974 | Cooper | 392/397 |
| 4,103,827 | 8/1978 | Kumazawa | 239/434 |
| 4,193,520 | 3/1980 | Duffield | 239/434 |
| 4,634,559 | 1/1987 | Eckert | |
| 4,802,630 | 2/1989 | Kromrey et al. | 239/434 |
| 5,259,883 | 11/1993 | Yamabe et al. | 118/725 |
| 5,262,318 | 11/1993 | Shero | 392/396 |
| 5,367,603 | 11/1994 | Wenrich et al. | 392/394 |
| 5,383,970 | 1/1995 | Asaba et al. | 118/726 |
| 5,409,310 | 4/1995 | Owczarz | 239/434 |
| 5,544,961 | 8/1996 | Fuks et al. | |
| 5,901,271 | 5/1999 | Benzing et al. | 392/396 |

FOREIGN PATENT DOCUMENTS

| | | |
|---|---|---|
| 471 321 | 2/1992 | European Pat. Off. . |
| 0 555 498 | 8/1993 | European Pat. Off. . |
| 0 399 041 | 11/1990 | Germany . |
| 5-243205 | 9/1993 | Japan . |
| 2544971 | 7/1996 | Japan . |

*Primary Examiner*—Sang Paik
*Attorney, Agent, or Firm*—Morrison & Foerster

[57] ABSTRACT

A vapor generating apparatus comprises: a convergent-divergent nozzle 50 having an inlet port 50a and an outlet port 50a for a gas for a vapor medium, the convergent-divergent nozzle 50 comprising a convergent nozzle portion 51a, which is formed so as to be tapered and narrowed from the inlet port 50a toward the outlet port 50b, and a divergent nozzle portion 51c, which is formed so as to be expanded from the convergent nozzle portion 51a toward the outlet port 50b; and a supply port 54 for a liquid to be evaporated, the supply port 54 being open to the divergent nozzle portion 51c of the convergent-divergent nozzle 50. Thus, it is possible to easily produce a gas using a smaller number of control factors, and it is possible to increase the amount of produced gas and decrease the vapor generating time.

12 Claims, 11 Drawing Sheets

VAPOR GENERATING METHOD AND APPARATUS USING SAME

BACKGROUND OF THE INVENTION

1. Field of the Invention

The present invention relates generally to a vapor generating method and an apparatus using the vapor generating method.

2. Related Background Art

There are known the CVD (Chemical Vapor Deposition) technique for supplying a compound gas of elements forming a thin film material to an object to be treated, such as a semiconductor wafer, to form a desired thin film by a chemical reaction in a vapor phase or on a wafer surface, and a drying technique for evaporating IPA (isopropyl alcohol) to allow the vapor gas to be in contact with an object to be treated (an object to be dried) to dry the object. In these CVD and IPA drying techniques, a vapor generating apparatus is used to generate a material gas and a dry gas.

The vapor generating apparatus uses: ① a bubbling method for bubbling a liquid to be evaporated, by utilizing an ultrasonic wave and a carrier gas and for heating the liquid to a predetermined temperature to produce a gas to supply the gas together with the carrier gas to a processing chamber; ② baking method for heating a liquid to be evaporated, which is contained in a heating tank or an evaporating dish, to produce a gas to transport the gas using its vapor pressure and for supplying a predetermined amount of gas to a processing chamber by means of a high-temperature mass flow controller; or ③ a direct injection method for allowing a liquid to be evaporated, which is transported by a pump, to pass through a gap between an orifice part and a diaphragm surface to vaporize the liquid and for heating the liquid to produce a gas to supply the gas to a processing chamber.

However, in the case of the bubbling method ①, there are many control factors to produce a predetermined gas, and it is required to perform strict temperature control in order to gasify the liquid to be evaporated. In addition, it is required to use a great amount of carrier gas, and there is a problem in that the quantitative ability and repeatability are not sufficient in accordance with the variation in consumption of the liquid to be evaporated (material).

In the case of the baking method ②, it is required to utilize the vapor pressure of the liquid to be evaporated (material) to perform the flow control by means of the high-temperature mass flow controller, and it is required to use a predetermined capacity of heating tank or evaporating dish, so that the structure is complicated and large. Thus, the costs are increased and there is a limit to the degree of freedom for designing the system. In addition, although the baking method has a smaller number of control factors in comparison with the bubbling method, since the baking method uses a low vapor pressure material, the produced pressure is low even if the low vapor pressure material is heated, so that there is a problem in that it is difficult to obtain a pressure required to stably transfer the vapor.

In addition, since the direct injection method ③ transports the liquid to be evaporated, in a liquid state to directly vaporize the liquid near a treatment part to perform the flow control, the direct injection method has a smaller number of control factors in comparison with the bubbling method and the baking method, and the size of the system can be decreased. However, since the direct injection method can cope with only a small amount of produced gas, there is a problem in that there is a limit to the use.

SUMMARY OF THE INVENTION

It is therefore an object of the present invention to eliminate the aforementioned problems and to provide a vapor generating method, which can easily produce a gas using a smaller number of control factors and which can increase the amount of produced gas and decrease the vapor generating time, and which can decrease the necessary time or until the supply of the IPA to the vapor generator is stopped after the IPA is supplied to the vapor generator, i.e., until the generation of the IPA gas is stopped after the IPA gas is generated and an apparatus using the vapor generating method.

In order to accomplish the aforementioned and other objects, according to one aspect of the present invention, a vapor generating method comprises the steps of: accelerating a flow velocity of a gas for a vapor medium to acoustic velocity and increasing the flow velocity; supplying a liquid to be evaporated, to the gas, the flow velocity of which has been increased, to suddenly produce a shock wave; and making the liquid misty by utilizing an energy of the produced shock wave.

The vapor generating method may further comprise a step of heating the misty liquid by heating means.

According to another aspect of the present invention, a vapor generating apparatus comprises: a convergent-divergent nozzle having an inlet port and an outlet port for a gas for a vapor medium, the convergent-divergent nozzle comprising a convergent nozzle portion, which is formed so as to be tapered and narrowed from the inlet port toward the outlet port, and a divergent nozzle portion, which is formed so as to be expanded from the convergent nozzle portion toward the outlet port; and a supply port for a liquid to be evaporated, the supply port being open to the divergent nozzle portion of the convergent-divergent nozzle.

The vapor generating apparatus may further comprise heating means for heating the liquid to be evaporated, the heating means being provided near or downstream of the divergent nozzle portion and the supply port for the liquid to be evaporated.

The vapor generating apparatus may further comprise: a branch line for connecting the inlet port side for the gas to the outlet port side for the gas; and pressure regulating means, provided in the branch line, for regulating a pressure relationship between the inlet port side and the outlet port side.

The heating means may have a heating body, which has at least two stages of heating power in the flowing direction of the gas. In this case, the heating power of the heating body may change from dense to non-dense in the flowing direction of the gas.

Alternatively, the heating means may have a plurality of heating bodies, each of which has at least two stages of heating power in the flowing direction of the gas. In this case, the heating power of each of the plurality of heating bodies may change from dense to non-dense in the flowing direction of the gas. In addition, the plurality of heating bodies is preferably capable of controlling the heating power thereof independently of each other.

The supply port for the liquid to be evaporated may be open to the divergent nozzle portion in the divergent nozzle portion. Alternatively, the supply port for the liquid to be evaporated may be open to the divergent nozzle portion upstream of the divergent nozzle portion.

The vapor generating apparatus may further comprise cooling means provided in a supply line for the liquid to be evaporated, the supply line being connected to the supply port for the liquid to be evaporated.

According to the present invention, when the gas for the vapor medium flows from the inlet port toward the outlet port of the convergent-divergent nozzle, the gas is accelerated by the convergent nozzle portion. Then, even if the gas enters the divergent nozzle portion after the velocity of the gas reaches the acoustic velocity at the narrowed portion (throat portion), the gas is further expanded and velocity-increased by a great pressure difference to be a supersonic flow to eject at a flow velocity higher than or equal to the acoustic velocity. In such a state, when the liquid to be evaporated is supplied from the supply port, a shock wave is suddenly produced, so that the energy of the shock wave makes the liquid to be evaporated misty. When the misty liquid to be evaporated is heated by the heating means, vapor is produced.

Figure 1:
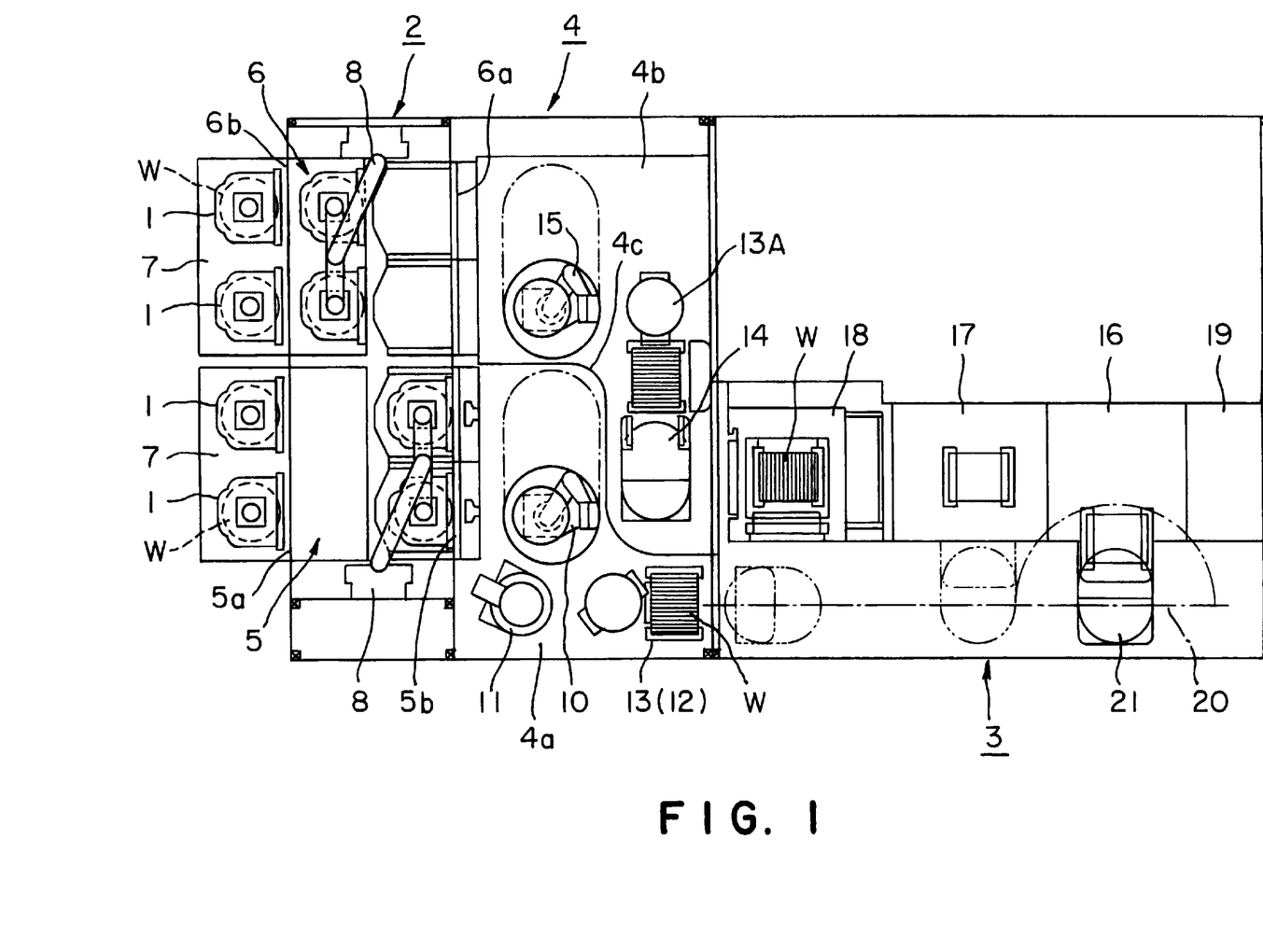
Figure 2:
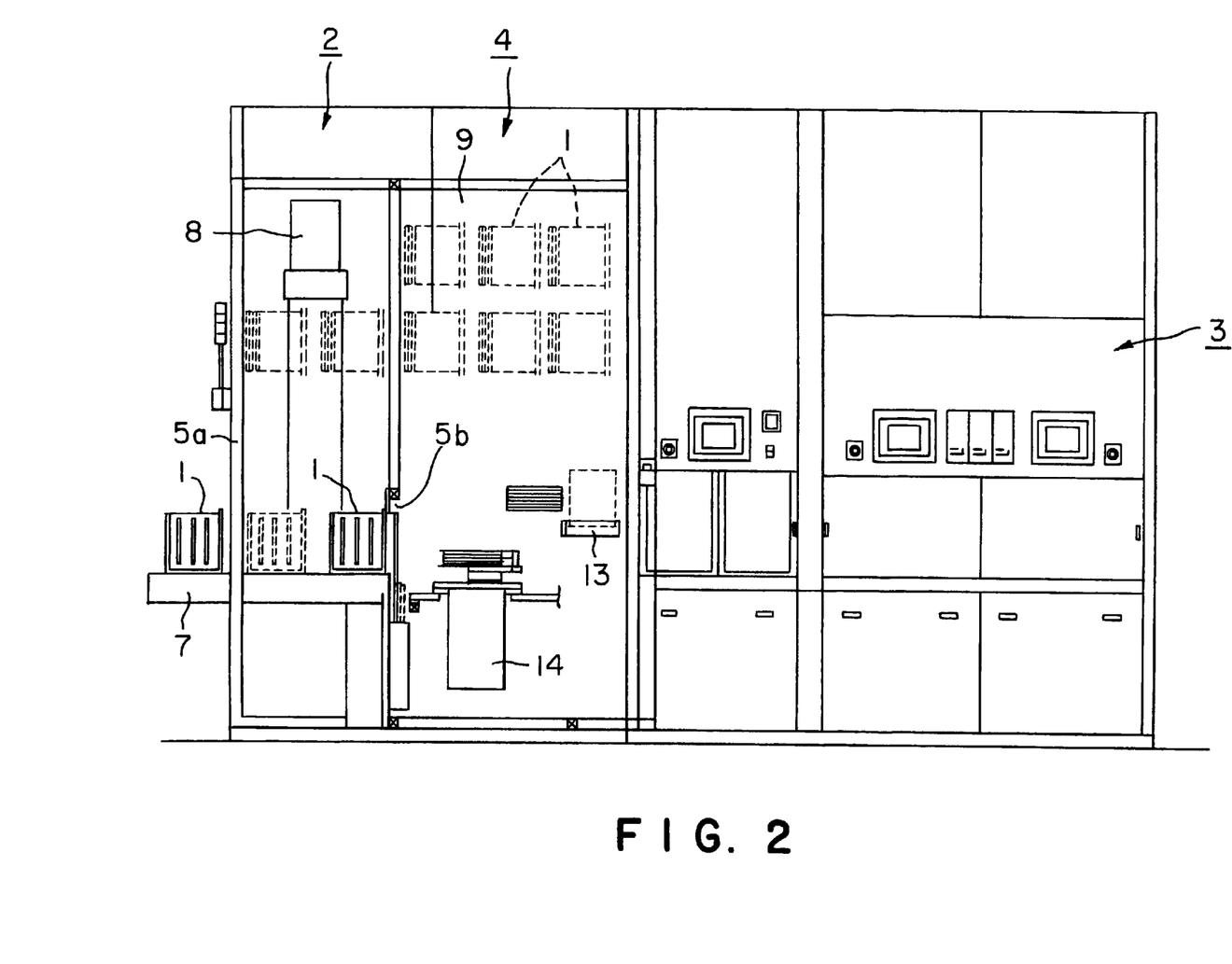

When the gas inlet port side and the gas outlet port side of the convergent-divergent nozzle are connected by means of the branch line in which the pressure regulating means is provided, it is possible to regulate the flow velocity of the gas flowing through the convergent-divergent nozzle, and it is possible to respond to the variation in supply of the carrier gas to the convergent-divergent nozzle and to suitably set the conditions for occurrence of the shock wave to respond to a wide range of amount of produced gas.

When the heating means comprises a single heating body or a plurality of heating bodies which have at least two stages of heating power in the flowing direction of the gas and when the heating power of the heating body changes from dense to non-dense in the flowing direction of the gas, it is possible to correct the temperature balance of the heating means, and it is possible to increase the life time of the heating means. In addition, when the liquid to be evaporated, e.g., IPA, is gasified, it is possible to prevent the liquid from being heated at a temperature higher than or equal to a predetermined temperature to be decomposed and carbonized to be adhered to the heating means. Therefore, it is possible to surely improve the reliability of the system.

In addition, when the heating means comprises the plurality of heating bodies having at least two stages of heating power in the flowing direction of the gas and when the heating power of each of the heating bodies can be controlled independently of each other, it is possible to surely correct the temperature balance of the heating means, and it is possible to increase the life time of the heating means and to prevent the liquid to be evaporated from being decomposed and carbonized to be adhered to the heating means. Therefore, it is possible to surely improve the reliability of the system.

Moreover, when the cooling means is provided in the supply pipe for the liquid to be evaporated, which is connected to the supply port for the liquid to be evaporated, it is possible to prevent the liquid to be evaporated from being evaporated by the thermal influence of the heating means before the liquid to be evaporated reaches the supply port when the supply amount of the liquid to be evaporated is small, so that it is possible to surely supply the liquid to be evaporated to the supply port while maintaining the liquid state.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 1 is a schematic plan view of a cleaning processing system, to which the preferred embodiment of a vapor generating apparatus according to the present invention is applied;

FIG. 2 is a schematic side view of the cleaning processing system of FIG. 1;

FIG. 3 is a schematic block diagram of a drying processing apparatus having the preferred embodiment of a vapor generating apparatus according to the present invention;

FIG. 4 is a sectional view the preferred embodiment of a vapor generating apparatus according to the present invention;

FIG. 5 is a graph showing the relationship of temperature distribution between a heater serving as a heating means of the present invention and a heater having a uniform heating power;

FIG. 6 is a graph showing the relationship between a primary pressure and the flow rate of a drying gas in a stream generating apparatus;

FIGS. 7(*a*) through 7(*d*) are sectional views of other preferred embodiments of a vapor generating apparatus according to the present invention;

FIG. 8 is a schematic sectional view of an embodiment of a processing chamber of the drying processing apparatus;

FIG. 9 is a schematic block diagram of another embodiment of a drying processing apparatus having the preferred embodiment of a vapor generating apparatus according to the present invention;

FIG. 10 is a sectional view of another preferred embodiment of a vapor generating apparatus according to the present invention;

FIG. 11(*a*) is a sectional view of another embodiment of a heater of the preferred embodiment of a vapor generating apparatus according to the present invention, and FIG. 11(*b*) is a local sectional view of a principal part of the heater of FIG. 11(*a*); and FIG. 12 is a sectional view of another embodiment of a heater of the preferred embodiment of a vapor generating apparatus according to the present invention.

DESCRIPTION OF THE PREFERRED EMBODIMENTS

Referring now to the accompanying drawings, the preferred embodiments of the present invention will be described in detail below. The shown embodiments are applied to a cleaning processing system for semiconductor wafers.

FIG. 1 is a schematic plan view of an embodiment of a cleaning processing system, to which the preferred embodiment of a vapor generating apparatus according to the present invention is applied, and FIG. 2 is a schematic side view of the cleaning processing system of FIG. 1.

The cleaning processing system generally comprises: a transport section 2 for performing the carrying in and out of a container, e.g., carrier 1, which houses therein semiconductor wafers W (which will be hereinafter referred to "wafers"), which are objects to be treated; a treatment section 3 for treating the wafers W with a solution, such as a chemical and a cleaning solution, and for drying the wafers W; and an interface section 4, arranged between the transport section 2 and the treatment section 3, for performing the delivery, position adjustment and attitude change of the wafers W.

The transport section 2 comprises an introducing part 5 and a discharging part 6, which are provided side by side on one side of the cleaning processing system. At each of the introducing port 5a of the introducing part 5 and the discharging port 6b of the discharging part 6, a slidable mount table 7 for carrying the carrier 1 in and out of each of the introducing port 5a and the discharging port 6b is provided. Each of the introducing part 5 and the discharging part 6 is provided with a carrier lifter 8 (a container transport means), by which the carrier 1 can be transported between the introducing parts or between the discharging parts and by which an empty carrier 1 can be delivered to a carrier waiting section 9 provided above the transport section 2 and can be received from the carrier waiting section 9 (see FIG. 2).

The interface section 4 is divided by a partition wall 4c into a first chamber 4a adjacent to the introducing part 5 and a second chamber 4b adjacent to the discharging part 6. The first chamber 4a houses therein: a wafer unloading arm 10 for unloading a plurality of wafers W from the carrier 1 in the input part 5 to transport the wafers W, the wafer unloading arm 10 being movable in horizontal directions (X, Y directions) and vertical directions (Z directions) and rotatable (in θ directions); a notch aligner 11 for detecting a notch formed in each of the wafers W; a space adjusting mechanism 12 for adjusting the space between the adjacent wafers W unloaded by the wafer unloading arm 10; and a first attitude changing unit 13 for changing the attitude of the wafer W from the horizontal state to the vertical state.

The second chamber 4b houses therein: a wafer delivering arm 14 for receiving a plurality of treated wafers W from the treatment section 3 to transport the wafers W while maintaining the vertical state of the wafers W; a second attitude changing unit 13A for changing the attitude of the wafers W received from the wafer delivering arm 14, from the vertical state to the horizontal state; and a wafer loading arm 15 for receiving the plurality of wafers W changed to the horizontal state by the second attitude changing unit 13A, to load the wafers W in an empty carrier 1 transported to the discharging part 6, the wafer loading arm 15 being movable in horizontal directions (X, Y directions) and vertical directions (Z directions) and rotatable (in θ directions). Furthermore, the second chamber 4b is sealed, and the interior thereof is replaced with an inert gas, e.g., $N_2$ gas supplied from a nitrogen ($N_2$) gas source (not shown).

The treatment section 3 includes: a first processing unit 16 for removing particles and organic contamination, which are adhered to the wafers W; a second processing unit 17 for removing metal contamination adhered to the wafers W; a cleaning/drying processing unit 18 for removing oxide films adhered to the wafers W and for drying the wafers W, and a chuck cleaning unit 19. The first processing unit 16, the second processing unit 17, the drying processing apparatus 18 and the chuck cleaning unit 19 are aligned with each other. In the treatment section 3, a wafer transport arm 21, which is movable in X and Y directions (horizontal directions) and in Z directions (vertical directions) and rotatable (θ ), is provided on a transport channel 20 facing the respective units 16 through 19.

Figure 3:
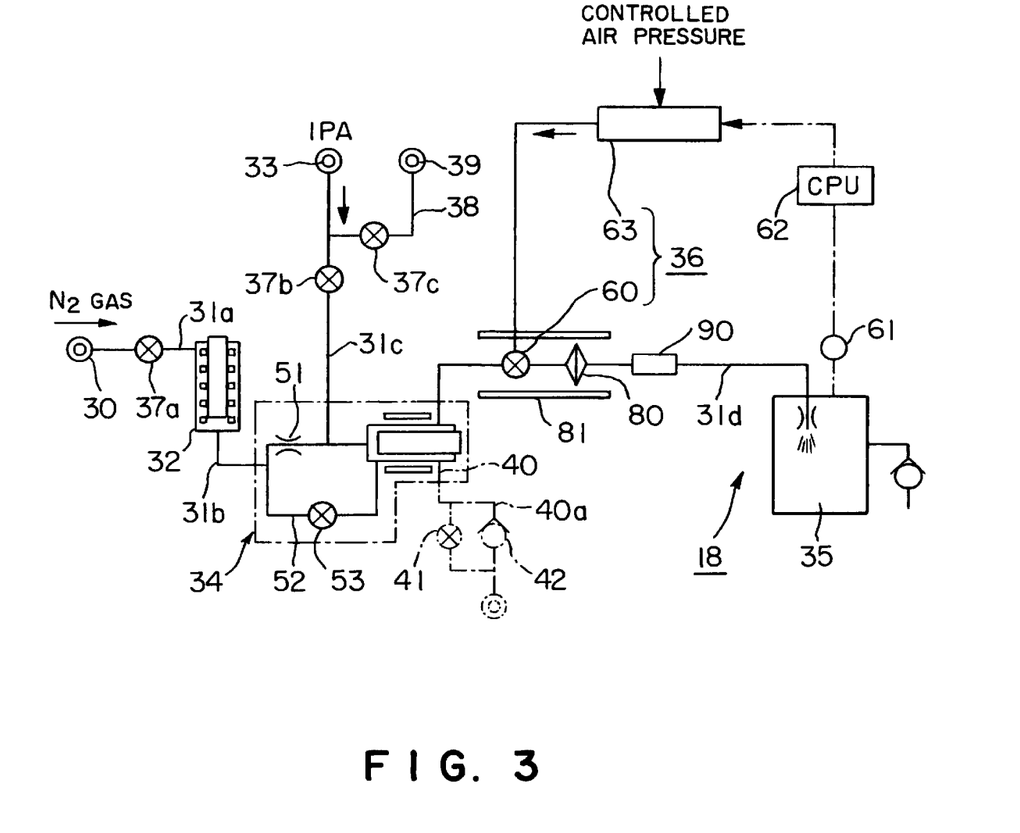

As shown in FIG. 3, the cleaning/drying processing unit 18 comprises: a $N_2$ gas heater 32 (which will be hereinafter referred to as a "heater") serving as a $N_2$ gas heating means connected to a carrier gas source, e.g., a nitrogen ($N_2$) gas source 30, via a supply line 31a; a vapor generating apparatus 34 of the present invention, which is connected to the heater 32 via a supply line 31b and which is connected to a source of a liquid for a dry gas, e.g., an IPA source 33, via a supply line 31c; a flow control means 36 provided in a supply line 31d for connecting the vapor generating apparatus 34 to a drying processing chamber 35 (which will be hereinafter referred to as a "processing chamber").

In this case, a shut-off valve 37a is provided in the supply line 31a which connects the $N_2$ gas source 30 to the heater 32. In addition, a shut-off valve 37b is provided in the supply line 31c which connects the IPA source 33 to the heater 32. An IPA recovering part 39 is connected to the shut-off valve 38b on the side of the IPA source via a branch line 38 and a shut-off valve 37c. As shown by the two-dot chain line in FIG. 3, if necessary, an IPA drain pipe 40 is connected to the vapor generating apparatus 34, and a drain valve 41 is provided in the drain pipe 40, to which a branch line 40a having a check valve 42 is connected. Such connections of the drain pipe 40, the drain valve 41 and so forth are convenient to discharge the cleaning solution and so forth when cleaning the interior of the vapor generating apparatus 34.

Figure 4:
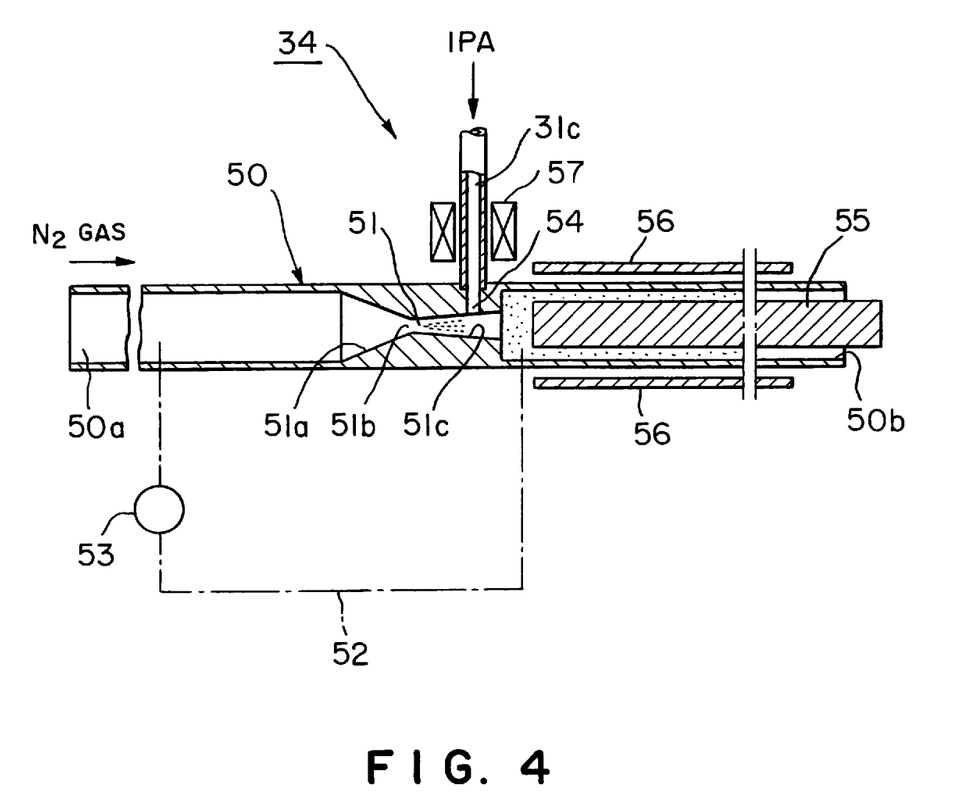

As shown in FIG. 4, the vapor generating apparatus 34 has a tubular convergent-divergent nozzle 50 of, e.g., stainless steel, which has an inlet port 50a connected to the supply line 31b for the carrier gas serving as a gas for a vapor medium and an outlet port 50b. The convergent-divergent nozzle 50 comprises: a convergent nozzle portion 51a, which is formed on the inner peripheral surface so as to be gradually narrowed in the flowing direction of the carrier gas; a divergent nozzle portion 51c, which is formed on the inner peripheral surface so as to be gradually expanded from a narrowed portion (throat portion) 51b of the convergent nozzle portion 51a in the flowing direction of the carrier gas; and a shock wave forming portion 51 formed on the outlet port side (secondary side) near the throat portion 51b.

The divergent nozzle portion 51c located near the throat portion 51b of the convergent-divergent nozzle 50 has a supply port 54 for IPA serving as a liquid to be evaporated. An IPA source 33 is connected to the supply port 54 via the IPA supply pipe, i.e., the supply line 31c.

Figure 9:
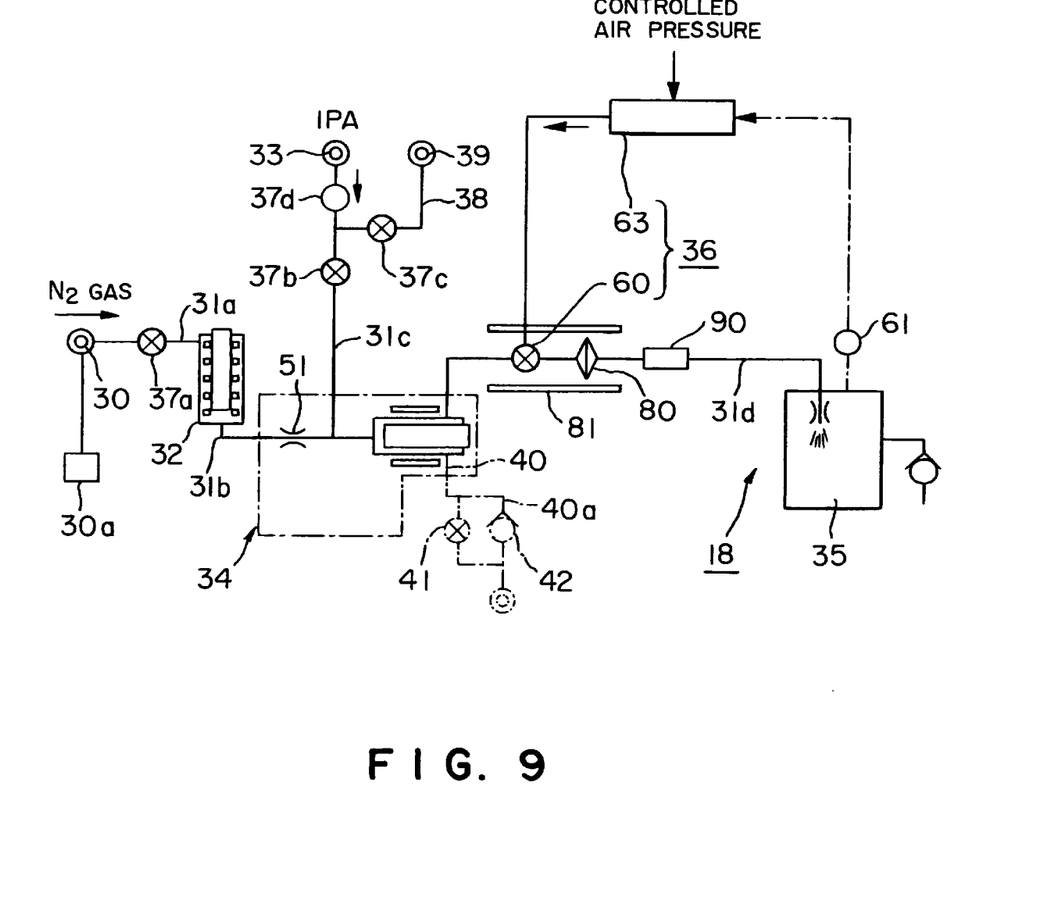

As shown in FIG. 9, a flow control means 37d, such as a pump, may be provided in the flow control means supply line 31c. In this case, it is possible to easily control the flow rate of IPA supplied from the IPA source 33 to the shock wave forming portion 51 by the flow control means 37d, if necessary.

In addition, an inner tube heater (a heating means) 55 serving as a first heating body is inserted into the convergent-divergent nozzle 50 on the side of the outlet port 50b of the divergent nozzle portion 51c, and an outer tube heater (a heating means) 56 serving as a second heating body is provided outside the convergent-divergent nozzle 50, so as to be capable of achieving two stages or more of heating power in the flowing direction. That is, the heating power is designed to change from dense to non-dense in the flowing direction of the carrier gas. In this case, heaters may be provided near the shock wave forming portion 51 and the IPA supply port 54.

A branch line 52 is connected to the sides of the inlet port 50a and outlet port 50b of the convergent-divergent nozzle 50. A pressure regulating valve 53 is provided in the branch line 52 so as to be capable of responding to the variation in supplying pressure of the carrier gas supplied to the convergent-divergent nozzle 50, by adjusting the pressure regulating valve 53. That is, since the orifice bore of the convergent-divergent nozzle is constant, not variable, when there is set an upper limit to the pressure on the primary side (the inlet port side) of the convergent-divergent nozzle, there is naturally set an upper limit to the flow rate of the carrier gas flowing through the convergent-divergent nozzle 50. However, when a greater flow rate of carrier gas than those of the processing conditions is required, if the branch line 52 is provided to introduce the carrier gas to the downstream side (the outlet port side) of the convergent-divergent nozzle 50, a wide range of flow rate can be supplied. In this case, the supplemental flow rate of the carrier gas can be adjusted by means of the pressure regulating valve 53 provided in the branch line 52. In addition, the conditions for occurrence of a shock wave can be suitably set by adjusting the pressure regulating valve 53.

Furthermore, if the inlet pressure (the primary pressure) can be increased, the flow rate of the carrier gas increases in proportion thereto, so that it is not particularly required to supplement the carrier gas by means of the branch line 53. That is, if the pressure or flow rate of the $N_2$ gas on the primary side can be adjusted in a predetermined high pressure range, it is possible to form a shock wave even if the pressure regulating valve 53 is not used. That is, as shown in FIG. 9, a $N_2$ gas pressure regulating means 30a for regulating the pressure or flow rate of $N_2$ gas is connected to the $N_2$ gas source 30, and the branch line 52 and the pressure regulating valve 53 are omitted. In this case, the $N_2$ gas source 30 must be capable of supplying $N_2$ gas having a higher pressure than that in the usual case so as to be capable of supplying a predetermined high pressure range of $N_2$ gas. When the pressure of $N_2$ gas supplied from the $N_2$ gas source 30 by the $N_2$ gas pressure regulating means 30a is adjusted, it is possible to adjust the pressure difference between the inlet pressure (primary pressure) and the outlet pressure (secondary pressure) of the shock wave forming portion 51 to suitably set the conditions for occurrence of the shock wave.

In addition, a cooling means 57 is provided in the IPA supply line 31c connected to the IPA supply port 54. The cooling means 57 is designed to cool IPA flowing through the supply line 31c to a temperature lower than or equal to the boiling point of IPA, e.g., by circulating and supplying a refrigerant to a jacket for covering the supply line 31c. Thus, when a very small amount of IPA is supplied by cooling the temperature of IPA to a temperature lower than or equal to the boiling point using the cooling means, it is possible to prevent IPA from being evaporated by the thermal influence of the heating means, i.e., the inner tube heater 55 and the outer tube heater 56, so that it is possible to surely and stably supply IPA from the supply port 54 of the convergent-divergent nozzle 50 while maintaining the liquid state of IPA.

Figure 5:
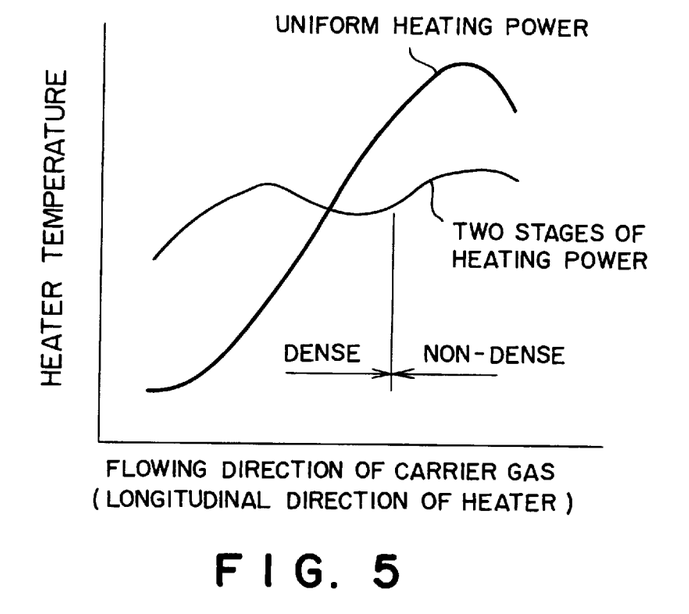

With this configuration when the carrier gas ($N_2$ gas), which is a gas for a vapor medium, flows from the inlet port of the convergent-divergent nozzle 50 to the outlet port thereof, the carrier gas is accelerated by the convergent nozzle portion 51a, and then, the velocity of the carrier gas reaches the acoustic velocity. Thereafter, even if the carrier gas enters the divergent nozzle, the carrier gas is further expanded to increase the velocity thereof by a great pressure difference to form a supersonic flow, so that the carrier gas ejects at a flow velocity of not less than the acoustic velocity to produce a shock wave. When IPA is supplied from the supply port 54 under such conditions, a shock wave is suddenly produced, so that the energy of the shock wave is utilized to make IPA misty. When the misty IPA is heated by means of the inner tube heater 55 and the outer tube heater 56, IPA gas (vapor) is produced. In this case, if at least two stages of heating power of the inner tube heater 55 and the outer tube heater 56 are provided in the flowing direction of the carrier gas and if the heating power changes from dense to non-dense in the flowing direction of the carrier gas, the temperature balance of the inner tube heater 55 and the outer tube heater 56 can be corrected, and the life time of the heaters 55, 56 can be increased. In addition, it is possible to prevent excessive heat and to prevent the IPA gas from being decomposed and carbonized. That is, as shown in FIG. 5, when the carrier gas is heated by means of a heater having a uniform heating power, the heater surface temperature has a great gradient in longitudinal direction (in the flowing direction of the carrier gas).

For example, when a thermocouple is provided in a heater and when the temperature is controlled so as to maintain at a predetermined temperature, the heater is energized to return the temperature of the thermocouple to the original temperature, so that the longitudinal temperature balance is further broken. Because the carrier gas is heated as it flows in the flowing direction, so that the temperature difference between the downstream heater portion and the carrier gas is decreased to inhibit the heat exchange to overheat the downstream heater portion.

On the other hand, if at least two stages of heating power of the heaters 55, 56 are provided in the flowing direction of the carrier gas and if the heating power is changed from dense to non-dense in the flowing direction of the carrier gas, the surface temperature of the heaters 55, 56 can be stabilized. Therefore, it is possible to increase the life time of the heaters 55, 56, and it is possible to prevent IPA gas from being decomposed and carbonized.

Figure 10:
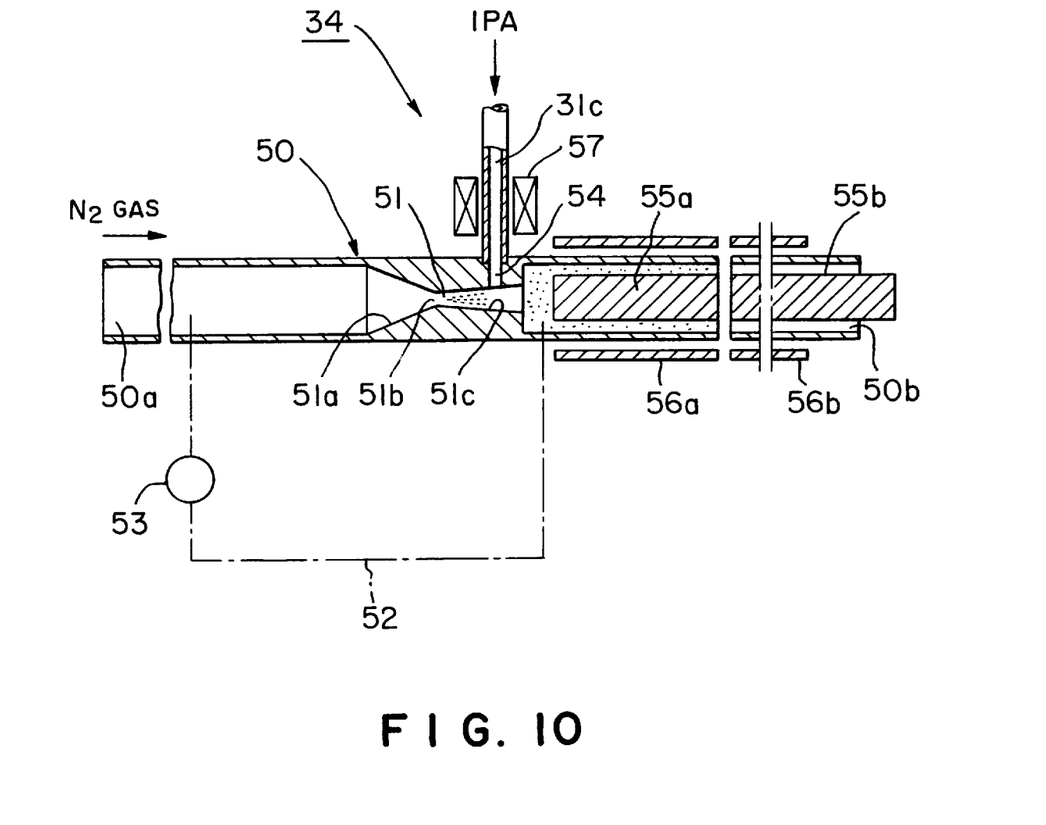

As shown in FIG. 10, the inner tube heater 55 may comprise a first inner tube heater 55a and a second inner tube heater 55b, which can be controlled independently of each other, and the outer tube heater 56 may comprise a first outer tube heater 56a and a second outer tube heater 56b, which can be controlled independently of each other. The first inner tube heater 55a and the first outer tube heater 56a are provided on the upstream side in the flowing direction of the carrier gas, and the second inner tube heater 55b and the second outer tube heater 56b are provided on the downstream side in the flowing direction of the carrier gas. The first inner tube heater 55a has a greater heating power than that of the second inner tube heater 55b, and the first outer tube heater 56a has a greater heating power than that of the second outer tube heater 56b.

If the first inner tube heater 55a and the second inner tube heater 55b are independently controlled and if the first outer tube heater 56a and the second outer tube heater 56b are independently controlled, the surface temperature of the heaters 55a, 55b, 56a and 56b can be surely controlled so as to have a desired distribution in the flowing direction of the carrier gas to be stabilized. Therefore, it is possible to increase the life time of the heaters 55a, 55b, 56a and 56b, and it is possible to IPA gas from being decomposed and carbonized. Furthermore, while each of the inner tube heater 55 and the outer tube heater 56 has been divided into two portions, it may be divided into three or more portions, which can be controlled independently of each other.

Figure 11A:
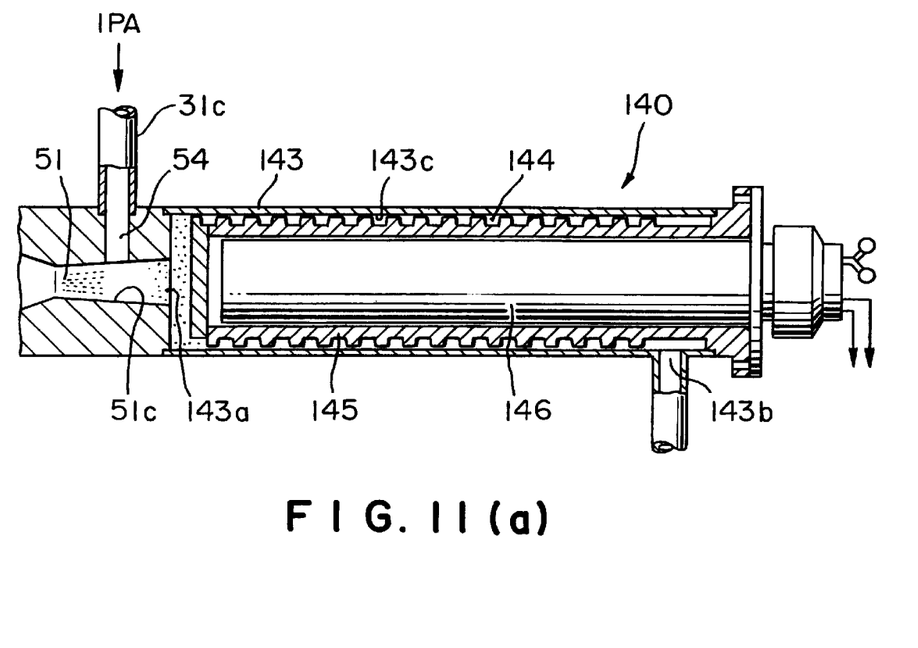
Figure 11B:
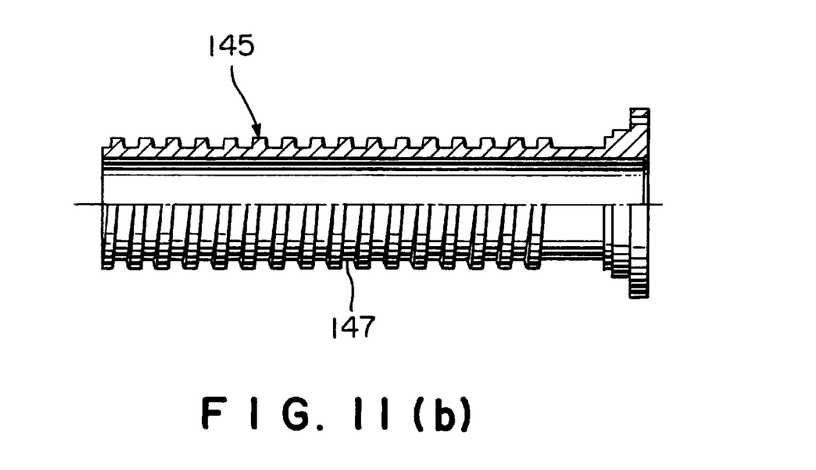

Furthermore, as shown in FIGS. 11(*a*) and 11(*b*), a heater 140 may be used in place of the inner tube heater 55 and the outer tube heater 56.

As shown in FIG. 11(*a*), the heater 140 generally comprises: an introducing pipe 143 communicating with the shock wave forming portion 51; a fluid passage forming pipe 145, which is inserted into the introducing pipe 143 and which forms a spiral fluid passage 144 between the inner wall surface of the introducing pipe 143 and the fluid passage forming pipe 145; and a heating means, e.g., a cartridge heater 146, which is inserted into the fluid passage forming pipe 145.

In this case, one end of the introducing pipe 143 has an inlet port 143a connected to the shock wave forming portion 51, and a side of the other end thereof is provided with an outlet port 143b connected to the supply line 31d. In addition, as shown in FIG. 11(b), a spiral groove 147, such as a trapezoidal screw thread, is formed in the outer periphery of the fluid passage forming pipe 145. The spiral fluid passage 144 is formed by the spiral groove 147 and the inner wall surface 143c of the introducing pipe 143. Furthermore, the structure of the spiral fluid passage 144 should not be limited to the above configuration. For example, a spiral groove may be formed in the inner wall surface of the introducing pipe 143, and the outer peripheral surface of the fluid passage forming pipe 145 may be a flat surface to form the spiral fluid passage. Alternatively, spiral grooves may be formed in both of the inner wall surface of the introducing pipe 143 and the outer peripheral surface of the fluid passage forming pipe 145 to form the spiral fluid passage. Furthermore, a heater for heating the outside of the introducing pipe 143 may be provided as a heating means in addition to the cartridge heater 146.

Figure 12:
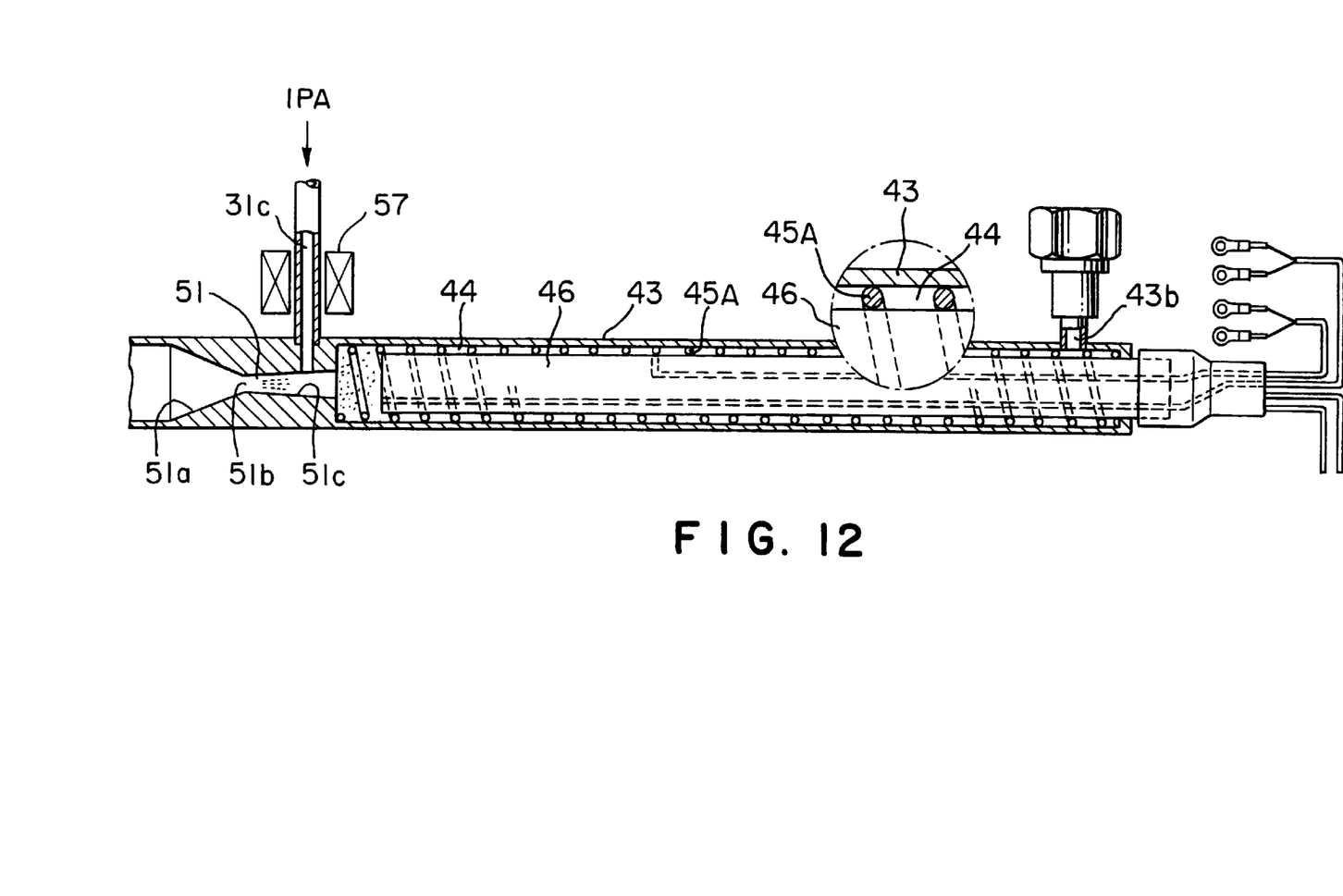

While the spiral fluid passage 144 has been formed by the introducing pipe 143 and the fluid passage forming pipe 145 inserted into the introducing pipe 143, the spiral fluid passage 144 may be formed by the introducing pipe 143 and a coil member, e.g., a coil spring 45A, inserted into the introducing pipe 143 as shown in FIG. 12. That is, the coil spring 45A may be inserted into the introducing pipe 143 and the cartridge heater 146 may be inserted into the coil spring 45A, so that the spiral fluid passage 144 may be formed by the introducing pipe 143 and the coil spring 45A provided between the introducing pipe 143 and the cartridge heater 146.

As described above, if the spiral fluid passage 144 is formed between the introducing pipe 143 connected to the shock wave forming portion 51 and the fluid passage forming pipe 145 or the coil spring 145A, which are inserted into the introducing pipe 143, the length of the fluid passage allowing the IPA gas passage to be in contact with the cartridge heater 146 can be increased, and a spiral flow can be formed to increase the flow velocity in comparison with the case that no spiral flow is formed. As a result, it is possible to increase the Reynold's number (Re number) and the Nusselt number (Nu number) to put the boundary layer in a turbulent region, so that it is possible to improve the efficiency of heat transfer of the heater 140. Therefore, since it is possible to effectively heat the IPA gas to a predetermined temperature, e.g., 200° C., by means of the cartridge heater 146, it is possible to reduce the size of the heater 140. Furthermore, in order to raise the heating temperature, an outer tube heater may be provided outside the introducing pipe 143.

Figure 6:
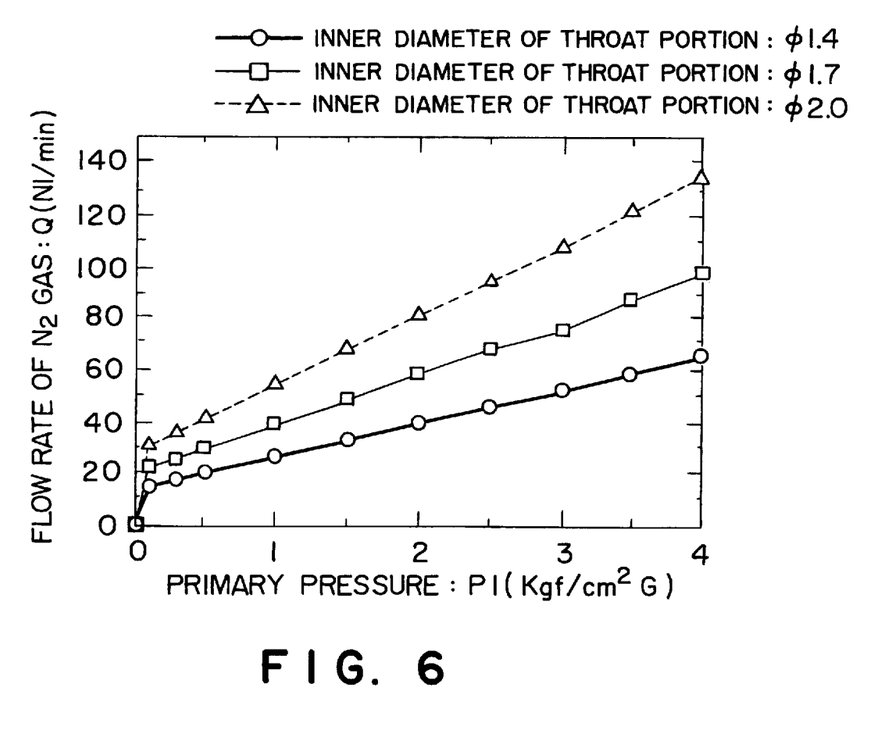

In this case, it is possible to form a shock wave by adjusting the pressure regulating valve 53, e.g., by suitably selecting the primary pressure (Kgf/cm$^2$G) and the passing flow rate of N$_2$ gas. For example, as shown in FIG. 6, assuming that the inner diameter of the throat portion 51c is 1.4 (mm), 1.7 (mm), 2.0 (mm), a shock wave is produced when the passing flow rate of the N$_2$ gas is 40 (Ni/min), 60 (Nl/min), 80 (Nl/min), respectively. Furthermore, the concentration of IPA thus produced is about 20 (%), about 30 (%) and about 40 (%), when the feed rate of IPA is 1 (cc/sec), 2 (cc/sec) and 3 (cc/sec), respectively, if the flow rate of N$_2$ gas is, e.g., 100 (Nl/min).

Figure 7A:
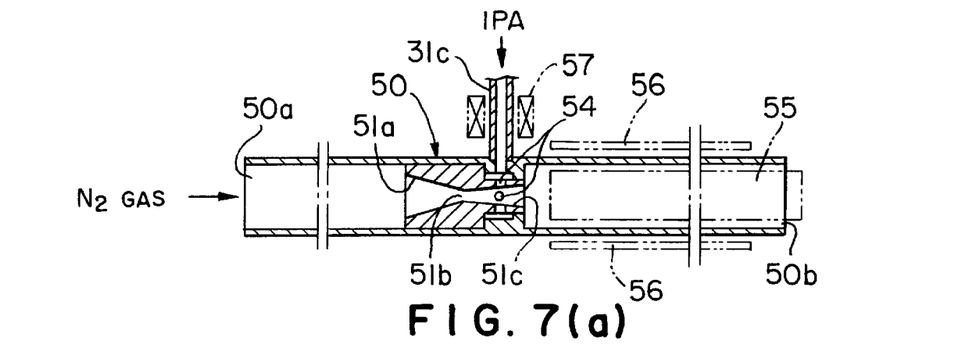

While the IPA supply port 54 has been provided at a single place of the divergent nozzle portion 51c of the convergent-divergent nozzle 50 in the above preferred embodiment, a plurality of IPA supply ports 54 may be provided at regular intervals in circumferential directions as shown in FIG. 7(a) (four IPA supply ports 54 are shown in the drawing). Thus, when the plurality of IPA supply ports 54 are provided on the divergent nozzle portion 51c at regular intervals in circumferential directions, it is possible to uniformly supply IPA in comparison with the case that the IPA supply port 54 is provided at a single place, so that it is possible to more effectively produce IPA vapor.

Figure 7B:
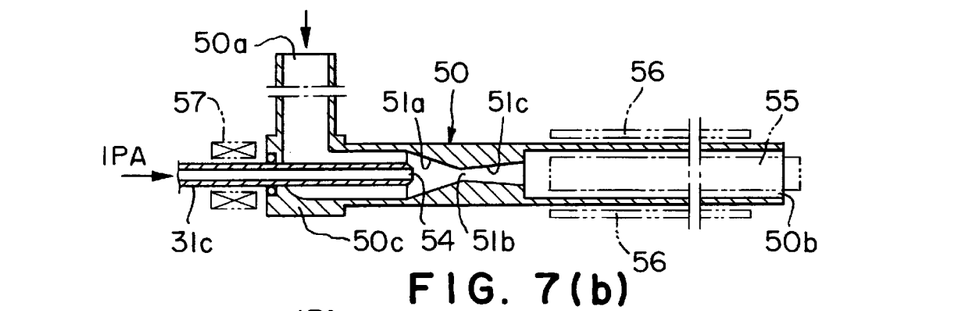

Alternatively, as shown in FIG. 7(b), the portion of the convergent-divergent nozzle 50 on the side of the outlet port 50a may be bent in the shape of an elbow, and the tip opening portion of the IPA supply pipe 31c passing through the bent portion 50c may be provided at the central portion of the convergent nozzle portion 51a to be open to the divergent nozzle portion 51c. Thus, the IPA supply pipe 31c may be provided in the convergent nozzle portion 51a to supply IPA to the convergent nozzle portion 51a to mix the carrier gas with the IPA, and thereafter, the shock wave may be produced to make IPA misty to produce vapor by the heating means 55, 56.

Figure 7C:
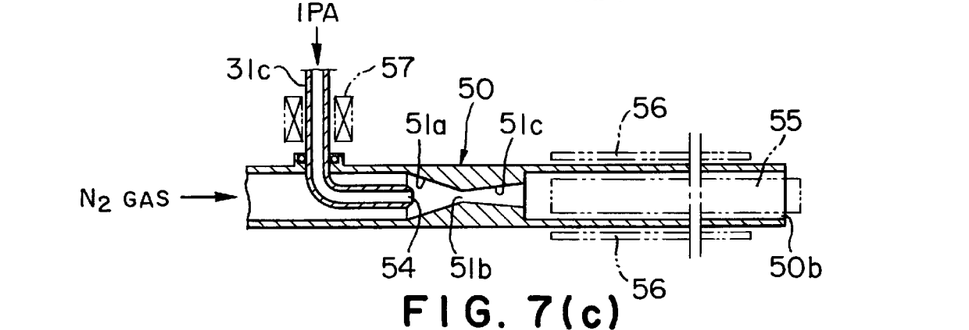

While the portion of the convergent-divergent nozzle 50 on the side of the inlet port 50a has been bent in the shape of an elbow to allow the IPA supply pipe 31c to pass through the bent portion 50c, the convergent-divergent nozzle 50 may be replaced with the IPA supply pipe 31c. That is, as shown in FIG. 7(c), the IPA supply pipe 31c bent in the shape of an elbow may be inserted into the convergent nozzle portion 51a of the linear convergent-divergent nozzle 50, and the tip opening portion of the IPA supply pipe 31c may be located at the central portion of the convergent nozzle portion 51a.

Figure 7D:
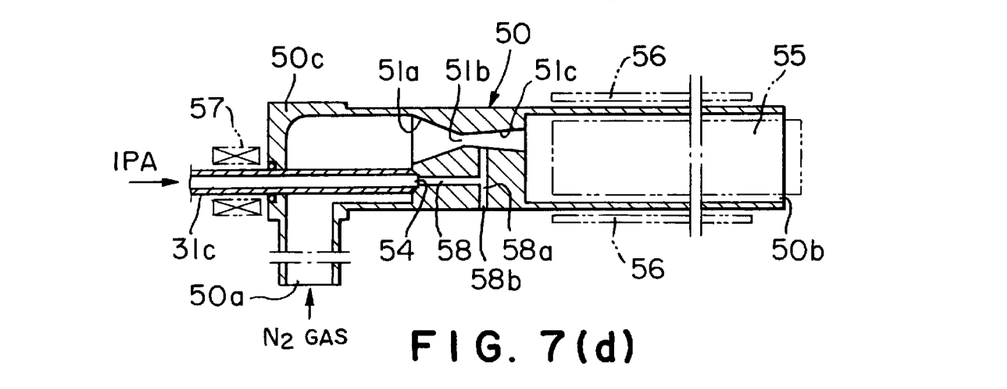

Alternatively, as shown in FIG. 7(d), a lateral L-shaped communication passage 58, one end of which is open to the divergent nozzle portion 51c and the other end of which is open to the inlet port of the convergent nozzle portion 51a, may be connected to the IPA supply pipe 31c passing through the bent portion 50c of the convergent-divergent nozzle 50. In this case, since it is required to form a through hole 50a in the divergent nozzle portion 51c in order to work the lateral L-shape communication passage 58, it is required to block the outside opening of the through hole 50a by means of a blocking plug 58b. Furthermore, in FIGS. 7(a) through 7(d), since other portions are the same as the corresponding portions in the above preferred embodiments, the same reference numbers are used for the same portions, and the descriptions thereof are omitted.

As shown in FIG. 3, the flow control means 36 comprises: an opening-angle adjusting valve, e.g., a diaphragm valve 60, provided in the supply line 31d; a control part, e.g., a CPU (central processinging unit) 62, for comparing a signal outputted from a pressure sensor 61 serving as a detecting means for detecting the pressure in the processing chamber 35, with a previously stored information; and a control valve, e.g., a micro valve 63, for controlling the working pressure of the diaphragm 60 on the basis of a signal outputted from the CPU 62.

Figure 8:
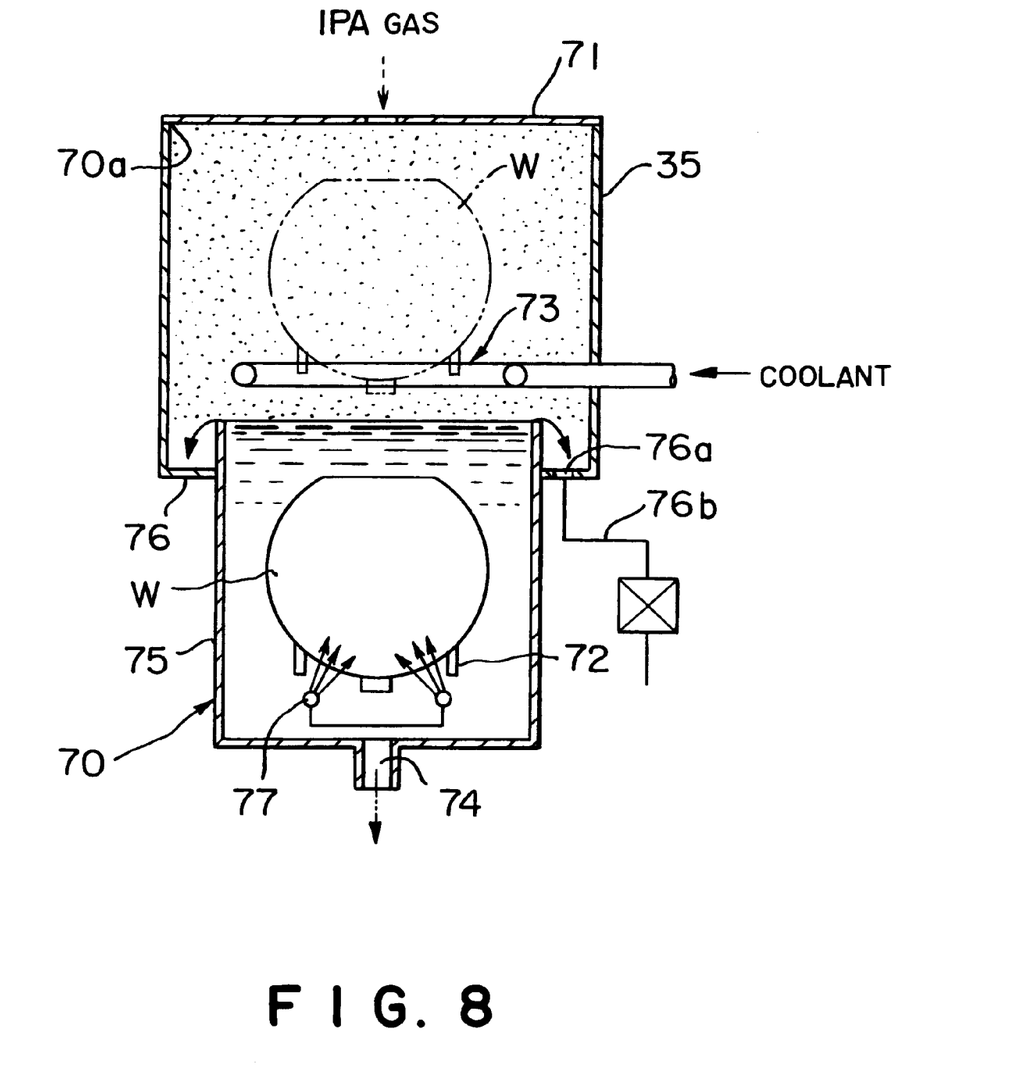

As shown in FIG. 8, the processing chamber 35 stores or contains a cleaning solution, such as a chemical of, e.g., hydroacid fluoride, and pure water, and the processing chamber 35 is arranged above a cleaning bath 70 for immersing the wafers W in the stored cleaning solution. A lid 71 is provided so as to open and close an opening 70a, which is formed above the processing chamber 35 for carrying the wafers W in and out. Between the processing chamber 35 and the cleaning bath 70, there is provided a holding means, e.g., a wafer boat 72, for holding a plurality of wafers W, e.g., 50 wafers W, to move the wafers W into the cleaning bath 70 and the processing chamber 35. In the processing chamber 35, a cooling pipe 73 for cooling the IPA gas supplied to the processing chamber 35 may be provided.

The cleaning bath 70 comprises an inner bath 75 having a bottom with a discharge port 74, and an outer bath 76 for receiving the cleaning solution overflowing the inner bath 75. A chemical or pure water is supplied from a chemical or pure water supply nozzle 77, which is provided on the lower portion of the inner bath 75, to the inner bath 75 to be stored therein. The wafers W is immersed in the chemical or pure water stored in the inner bath 75 to be cleaned. In addition, a discharge pipe 76b is connected to the discharge port 76a provided on the bottom of the outer bath 76. With this configuration, the cleaned wafers W are moved to the processing chamber 35 by means of the wafer boat 72 to be in contact with the IPS gas supplied to the processing chamber, so that the IPA vapor is condensed or absorbed to remove the moisture of the wafers W to dry the wafers W.

A filter 80 is provided in the supply line 31d downstream (secondary side) of the diaphragm valve 60 so as to be capable of supplying a dry gas having a small amount of particles. An insulation heater 81 is provided outside the supply line 31d so as to be capable of maintaining the temperature of the IPA gas.

An IPA gas temperature sensor 90 (a temperature detecting means) is provided in the supply line 31d on the side of the processing chamber 35 so as to measure the temperature of the IPA gas flowing through the supply line 31d.

The operation of the preferred embodiment of a drying processing unit according to the present invention will be described below.

First, after the wafers W carried in the cleaning bath 70 are cleaned, the wafer boat 72 is moved upwards into the processing chamber 35. At this time, the processing chamber 35 is closed by the lid 71. In this state, the dry gas, i.e., the IPA gas, which is generated in the vapor generating apparatus 34 by the $N_2$ gas heated by the heater 32, is supplied to the processing chamber 35, so that the IPA gas contacts the wafers W. Thus, the IPA vapor is condensed or absorbed to remove the moisture of the wafers W and dry the wafers W.

When or immediately before the drying processing is completed, the supply of the IPA is stopped. During drying, the processing chamber 35 may be exhausted by the exhaust pipe 76b or pressure-reduced if necessary, so that the pressure in the processing chamber 35 may be lower than atmospheric pressure. The CPU 62 compares a signal outputted from the pressure sensor 61 for detecting the pressure in the processing chamber 35 with the previously stored information to output a signal to the micro valve 63. Then, the diaphragm valve 60 is operated by the control fluid, e.g., air, delayed and controlled by the micro valve 63 to supply a small amount of $N_2$ gas to the processing chamber 35 in accordance with the pressure in the processing chamber 35, so that the atmosphere in the processing chamber 35 is gradually changed from a state below atmospheric pressure to an atmospheric pressure state. Therefore, after the drying processing, the atmosphere in the processing chamber 35 is not rapidly changed from the state below atmospheric pressure to the atmospheric pressure state, so that it is possible to prevent particles from being raised and adhered to the wafers W.

Thus, after the pressure in the processing chamber 35 is replaced with atmospheric pressure, the lid 71 is open. Then, the wafers W are delivered between the transport arm (not shown), which has moved to a position above the processing chamber, and the wafer boat 72, which has moved upwards. The transport arm, which has received the wafers W, moves from the position above the processing chamber 35 to transport the wafers W to the interface section 4.

While the vapor generating apparatus of the present invention has been applied to the cleaning processing system for semiconductor wafers in the above preferred embodiments, the present invention may be applied to other processing systems than the cleaning processing system, e.g., to a CVD thin film forming processing system. In this case, different kinds of organic source gases, high-dielectric-constant source material gases and so forth may be used for gate insulating dielectric films, capacitor insulating films, interlayer insulating films and so forth, which are to be formed. For example, TEOS (tetraethoxy silane ($Si(OC_2H_5)_4$)), TMP (trimethyl phosphate ($PO(OCH_3)_3$)), TMB (trimethyl borate ($B(OCH_3)_3$)) or PZT (zirconium titanate ($PbTiO_3$)) may be used as a liquid to be evaporated, to form a thin film of a desired material. In addition, the invention may be applied to glass substrates for LCDs other than semiconductor wafers.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A vapor generating method comprising the steps of:
    accelerating a flow velocity of a gas to acoustic velocity;
    producing a shock wave in a convergent-divergent nozzle by passing said gas from a convergent nozzle portion to a divergent nozzle portion;
    supplying a liquid to said gas;
    making said liquid into a misty liquid by utilizing an energy of the produced shock wave; and
    heating the misty liquid.

2. A vapor generating method as set forth in claim 1, further comprising the step of heating the gas prior to producing the shock wave.

3. A vapor generating apparatus comprising:
    a convergent-divergent nozzle having an inlet port and an outlet port for a gas for a vapor medium, said convergent-divergent nozzle comprising a convergent nozzle portion, which is formed so as to be tapered and narrowed from said inlet port toward said outlet port, and a divergent nozzle portion, which is formed so as to be expanded from said convergent nozzle portion toward said outlet port, wherein said gas is accelerated to acoustic velocity in said convergent nozzle portion, a pressure of said gas or a flow rate of said gas in said inlet port side is controlled so that a shock wave can be produced when said gas passes from said convergent nozzle portion to said divergent nozzle portion;
    a supply port for a liquid to be evaporated, said supply port being open to said divergent nozzle portion of said convergent-divergent nozzle, wherein when said liquid is supplied from the supply port, an energy of the shock wave evaporates the liquid into a misty liquid; and a heat device for heating said misty liquid, said heat device being provided near said divergent nozzle portion.

4. A vapor generating apparatus as set forth in claim 3, which further comprises:

a branch line for connecting said inlet port side for said gas to said outlet port side for said gas; and pressure regulating means, provided in said branch line, for regulating a pressure relationship between said inlet port side and said outlet port side.

5. A vapor generating apparatus as set forth in claim 3, wherein said heating device includes a heating body having has at least two stages of heating power in the flowing direction of said gas.

6. A vapor generating apparatus as set forth in claim 5, wherein said heating power of said heating body changes from dense to non-dense in the flowing direction of said gas.

7. A vapor generating apparatus as set forth in claim 3, wherein said heating device includes a plurality of heating bodies, each of said heating body having at least two stages of heating power in the flowing direction of said gas.

8. A vapor generating apparatus as set forth in claim 7, wherein said heating power of each of said plurality of heating bodies changes from dense to non-dense in the flowing direction of said gas.

9. A vapor generating apparatus as set forth in claim 7, wherein said plurality of heating bodies are capable of controlling the heating power thereof independently of each other.

10. A vapor generating apparatus as set forth in claim 3, wherein said supply port for said liquid to be evaporated is open to said divergent nozzle portion upstream of said divergent nozzle portion.

11. A vapor generating apparatus as set forth in claim 3, which further comprises cooling means provided in a supply line for said liquid to be evaporated, said supply line being connected to said supply port for said liquid to be evaporated.

12. A vapor generating apparatus as set forth in claim 3, wherein said heat device has an inner tube heater which is provided in a passing region where said misty liquid passes.

* * * * *